US008891078B2

(12) United States Patent
Hatakeyama

(10) Patent No.: US 8,891,078 B2

(45) Date of Patent: Nov. 18, 2014

(54) SOLAR SIMULATOR

(75) Inventor: Yutaka Hatakeyama, Tokyo (JP)

(73) Assignee: Yamashita Denso Corporation, Tokyo (JP)

( * ) Notice: Subject to any disclaimer, the term of this patent is extended or adjusted under 35 U.S.C. 154(b) by 68 days.

(21) Appl. No.: 13/702,356

(22) PCT Filed: Jun. 2, 2011

(86) PCT No.: PCT/JP2011/062670

§ 371 (c)(1),
(2), (4) Date: Dec. 6, 2012

(87) PCT Pub. No.: WO2011/158658

PCT Pub. Date: Dec. 22, 2011

(65) Prior Publication Data

US 2013/0161537 A1 Jun. 27, 2013

(30) Foreign Application Priority Data

Jun. 18, 2010 (JP) ................................. 2010-139744

(51) Int. Cl.

| | |
|---|---|
| ***H01L 31/20*** | (2006.01) |
| ***F21S 8/00*** | (2006.01) |
| ***G01R 31/26*** | (2014.01) |

(52) U.S. Cl.

CPC .......... *G01R 31/2605* (2013.01); *H01L 31/206* (2013.01); *F21S 8/006* (2013.01); *Y02E 10/50* (2013.01)

USPC ..................................................... 356/139.01

(58) Field of Classification Search

CPC .. H01L 31/206; G01R 31/2605; G01R 31/26; G01N 21/88–21/89

USPC ............ 356/3.01–3.15, 4.01–4.1, 5.01–5.15, 356/6–22, 28, 28.5, 139.01–139.1

See application file for complete search history.

(56) References Cited

U.S. PATENT DOCUMENTS

2002/0030819 A1* 3/2002 Roulleau et al. .............. 356/430
2006/0290344 A1 12/2006 Shimotamai et al.

FOREIGN PATENT DOCUMENTS

| | | |
|---|---|---|
| JP | 60-116181 | 6/1985 |
| JP | 2001-345474 | 12/2001 |
| JP | 2005-317870 | 11/2005 |
| JP | 2007-88419 | 4/2007 |

OTHER PUBLICATIONS

International Search Report.

* cited by examiner

*Primary Examiner* — Luke Ratcliffe

(74) *Attorney, Agent, or Firm* — Frommer Lawrence & Haug LLP

(57) ABSTRACT

A solar simulator includes a light source having an optical axis linearly elongated, a feed means for feeding a long continuous film-shaped irradiation object, and a position regulating means for regulating the long continuous film-shaped irradiation object in position to surround the light source so that a center of the long continuous film-shaped irradiation object is coaxial with the optical axis. The long continuous film-shaped irradiation object regulated in position is irradiated with light from the light source.

16 Claims, 4 Drawing Sheets

14a
10
11
13
17a
14
13
15
16
12
12a
13
17

SOLAR SIMULATOR

TECHNICAL FIELD

The present invention relates to a solar simulator for generating pseudo solar light having a spectral distribution close to that of natural sunlight to irradiate the generated light to an irradiation object, and more specifically, to a solar simulator capable of irradiating pseudo solar light onto a long continuous film-shaped irradiation object.

BACKGROUND ART

A solar simulator generally has a structure to irradiate a tabular solar panel with pseudo solar light in order to measure photoelectric conversion characteristics such as I-V characteristics.

As an example, Patent Literature 1 discloses a pseudo solar light irradiation device for measuring an output of a solar panel by irradiating a solar battery panel retained by a support on the solar panel side in a dark room with light emitted from a xenon flash lamp.

Patent Literature 2 discloses a solar simulator in which a standard solar battery panel and a solar battery panel serving as an object to be measured are placed opposite a xenon flash lamp for measuring electric current and electric voltage sequentially output from these solar battery panels.

CITATION LIST

Patent Literature

Patent Literature 1: Japanese Patent Publication No. 2005-317870A

Patent Literature 2: Japanese Patent Publication No. 2007-088419A

SUMMARY OF INVENTION

Technical Problem

In recent years, a solar battery using a lightweight and flexible plastic film as a substrate has been developed as an amorphous silicon solar cell. This solar battery is configured by laminating an amorphous silicon film on a long continuous substrate of roll-to-roll type. Such a large-area and continuous film-shaped solar battery may induce the following difficulties when its photoelectric conversion characteristics such as I-V characteristics are measured by using the conventional solar simulator as disclosed in Patent Literatures 1 and 2.

(1) It is necessary to cut up such long solar battery for making the measurement since the long film-shaped solar battery cannot be continuously fed to a pseudo solar light irradiating section;

(2) It is hard to measure over the entire area of such long solar battery with high precision since every part of the long film-shaped solar battery cannot be arranged on the pseudo solar light irradiating section on the same conditions;

(3) Increasing in area of the pseudo solar light irradiating section in order to irradiate the long film-shaped solar battery having a large area with the pseudo solar light may bring about scattering due to luminance unevenness or nonparallel light; and (4) In order to irradiate the long film-shaped solar battery having a large area with the pseudo solar light, it is necessary to use a plurality of lamps causing whole device size to increase.

Solution to Problem

It is an object of the present invention to provide a solar simulator capable of continuously measuring a long film-shaped irradiation object without cutting up the irradiation object.

It is another object of the present invention to provide a solar simulator capable of making a high-precision measurement over the entire area of the long film-shaped irradiation object.

It is further object of the present invention to provide a solar simulator capable of making the measurement by irradiating the long film-shaped irradiation object with pseudo solar light which is uniform collimated light having little luminance unevenness.

It is a still further object of the present invention to provide a solar simulator capable of reducing entire size of a device even if it is used for irradiating a long film-shaped irradiation object.

According to the present invention, a solar simulator includes a light source having an optical axis linearly elongated, a feed means for feeding a long continuous film-shaped irradiation object, and a position regulating means for regulating the long continuous film-shaped irradiation object in position to surround the light source so that a center of the long continuous film-shaped irradiation object is coaxial with the optical axis. The long continuous film-shaped irradiation object regulated in position is irradiated with light from the light source.

The measurement of the characteristics of the long continuous film-shaped irradiation object is performed by feeding the irradiation object from the feed means, regulating the irradiation object in position to surround the light source so that a center of the irradiation object is coaxial with the linearly elongated optical axis by means of the position regulating means, and irradiating the irradiation object with the light from the light source. Since the irradiation object regulated to surround the light source so that the center thereof is coaxial with the optical axis is irradiated with the light from the light source, the long film-shaped irradiation object can be continuously measured with regard to its output without being cut. Thus, it is possible to execute high-precision measurement over the entire area of the irradiation object. Furthermore, as the light radially radiated from the light source is applied to the irradiation object, it is possible to lessen luminance unevenness and apply uniform collimated light. Additionally, as the long film-shaped irradiation object can be irradiated with a single light source, the entire size of the device can be reduced.

It is preferred that the position regulating means includes a single cylinder arranged around the light source coaxially with the optical axis, that at least a surrounding wall of the single cylinder is formed of optically transparent material, and that the long continuous film-shaped irradiation object is wound around an outward peripheral surface of the single cylinder. In this case, it is also preferred that the solar simulator further includes a stray light shielding cover with an inward surface of low reflectivity arranged coaxially with the optical axis to surround the outward peripheral surface of the cylinder.

It is further preferred that the position regulating means includes a plurality of position regulating rollers arranged at the same distance from the optical axis around the light source to regulate the long continuous film-shaped irradiation object in position on outward surfaces of the position regulating rollers.

It is still further preferred that the solar simulator further includes a tensioning means for imparting a tension force to the long continuous film-shaped irradiation object along a feeding direction of the long continuous film-shaped irradiation object.

It is further preferred that the position regulating means includes a plurality of position regulating rollers arranged at the same distance from the optical axis around the light source to regulate the long continuous film-shaped irradiation object in position on inward surfaces of the position regulating rollers.

It is further preferred that the solar simulator further includes a cylindrical characteristic-adjusting optical element arranged coaxially with the light source between the light source and the position regulating means to adjust spectral distribution characteristic. The interposition of the optical element there between facilitates attainment of the spectral distribution meeting the global standards.

It is further preferred that the light source includes a straight xenon flash lamp.

According to the present invention, also, a solar simulator includes a light source having an optical axis linearly elongated, a single cylinder arranged around the light source coaxially with the optical axis and having a surrounding wall formed of optically transparent material, a first feed means for feeding a first long continuous film-shaped irradiation object, a first position regulating means for regulating the first long continuous film-shaped irradiation object in position to wind the first long continuous film-shaped irradiation object around an upper part of an outward peripheral surface of the single cylinder, a second feed means for feeding a second long continuous film-shaped irradiation object, and a second position regulating means for regulating the second long continuous film-shaped irradiation object in position to wind the second long continuous film-shaped irradiation object around a lower part of the outward peripheral surface of the single cylinder. The first and second long continuous film-shaped irradiation objects regulated in position are irradiated with the light from the light source.

The measurement of the characteristics of the first and second long continuous film-shaped irradiation objects is performed by respectively feeding the first and second irradiation objects from the first and second feed means, regulating these irradiation object in position to surround the light source so that a center of the irradiation object is coaxial with the linearly elongated optical axis by means of the first and second position regulating means so as to wind at least the surrounding wall around the upper part and lower part of the outward peripheral surface of the single cylinder, and irradiating the first and second irradiation objects with the light from the light source. Since the irradiation objects regulated in position to be wound respectively around the upper part and lower part of the outward peripheral surface of the cylinder disposed coaxially around the light source having the straight optical axis, the first and second irradiation objects having different characteristics can be simultaneously measured with high precision and in a short time, as well. As a matter of course, the long film-shaped irradiation object can be continuously measured with regard to its output without being cut and a high-precision measurement can be performed over the entire area of the long film-shaped irradiation object. Furthermore, as the light radially radiated from the light source is applied to the irradiation objects, it is possible to lessen luminance unevenness and apply uniform collimated light. Additionally, as the long film-shaped irradiation objects can be irradiated with a single light source, the entire size of the device can be reduced.

It is preferred that the solar simulator further includes a tensioning means for imparting a tension force to the first and second long continuous film-shaped irradiation objects along feeding directions of the first and second long continuous film-shaped irradiation objects.

It is also preferred that the solar simulator further includes a cylindrical characteristic-adjusting optical element arranged coaxially with the light source between the light source and the position regulating means to adjust spectral distribution characteristic.

It is further preferred that the light source includes a straight xenon flash lamp.

Advantageous Effects of Invention

According to the present invention, as the irradiation object specified to surround the light source centering on the optical axis is irradiated with the light from the light source, even the long film-shaped irradiation object can be continuously measured with regard to its output without being cut, thus to enable high-precision measurement over the entire area of the irradiation object. Furthermore, as the light radially radiated from the light source is applied to the irradiation object, it is possible to lessen luminance unevenness and produce uniform collimated light. Additionally, as the long film-shaped irradiation object can be irradiated with a single light source, the entire size of the device can be reduced.

REFERENCE SIGNS LIST

10 Xenon flash lamp

Figure 1:
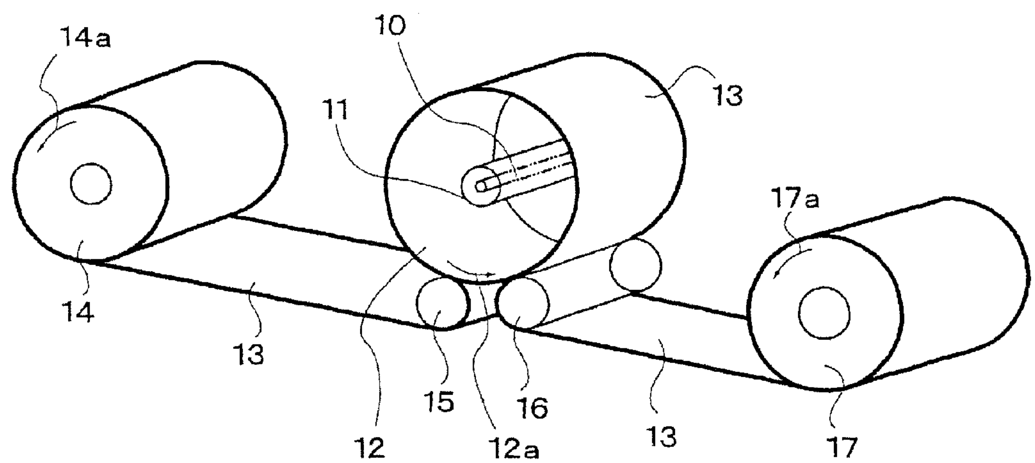
FIG. 1 is a perspective view schematically illustrating a partial configuration of a first embodiment of a solar simulator according to the present invention.

11 Cooling tube with optical property adjusting filter

12 Glass tube

12*a*, 14*a*, 17*a*, 141*a*, 142*a*, 171*a*, 172*a* Direction of axial rotation

13, 131, 132 Film-shaped solar battery

14, 141, 142 Feed roll

15, 16, 151, 152, 161, 162 Guide roller

17, 171, 172 Take-up roll

18 Stray light shielding cover
19, 20 Position regulating roller
21, 22, 231, 232 Pinch roller
233 Common pinch roller

DESCRIPTION OF EMBODIMENTS

FIG. 1 schematically illustrates a configuration of a section irradiated with pseudo solar light in a first embodiment of the solar simulator according to the present invention. An irradiation object of the solar simulator in this embodiment is a long film-shaped solar battery of roll-to-roll type. The solar simulator irradiates this solar battery with a pseudo solar light to measure photoelectric conversion characteristics thereof.

In the drawing, reference numeral 10 denotes a long and straight xenon flash lamp (corresponding to a light source in the present invention) having a linearly elongated optical axis, 11 denotes a cooling tube with an optical property adjusting filter (corresponding to a characteristic-adjusting optical element in the present invention), which is coaxially arranged around the xenon flash lamp 10, and 12 denotes a glass tube (corresponding to a cylinder in the present invention) coaxially arranged around the xenon flash lamp 10 and the cooling tube with the optical property adjusting filter 11, respectively.

At least a surrounding wall of the glass tube 12 is formed of optically transparent glass material, so that the long film-shaped solar battery 13 regulated in position is tightly wound around an outward peripheral surface of the glass tube 12. Further, the glass tube 12 is axially rotated freely or forcibly by means of a motor in the direction shown by an arrow 12*a*.

The film-shaped solar battery 13 is for example an amorphous silicon solar battery formed on a long substrate of a continuous flexible plastic film. This film-shaped solar battery 13 is supplied from a feed roll 14 (corresponding to a feed means in the present invention), and rewound onto a take-up roll 17 in a roll-to-roll manner. That is, the film-shaped solar battery 13 is fed from the feed roll 14 axially rotating in the direction shown by an arrow 14*a*, wound around the glass tube 12 in close contact with the outward peripheral surface of the glass tube 12 under favor of guiding of guide rollers 15 and 16, and then, rewound on the take-up roll 17 axially rotating in the direction shown by an arrow 17*a* after completion of irradiation of the pseudo solar light and measurement.

The xenon flash lamp 10 in this embodiment is a common long xenon lamp of a straight tube type capable of generating a flash light having a light-emitting pulse width of the order of about 5 to 100 milliseconds, for example.

The cooling tube with the optical property adjusting filter 11 allows gas or liquid to flow inside thereof to cool the xenon flash lamp 10. This cooling tube 11 has an air mass filter fixed to an outward peripheral surface thereof for adjusting the spectral distribution characteristic of the light passing through this outward peripheral surface. Using of such air mass filter facilitates attainment of the spectral distribution that conforms to the global standards.

Hereinafter, operations of the irradiation of the pseudo solar light and the measurement of the I-V characteristics in this embodiment will be described.

First, the film-shaped solar battery 13 is fed from the feed roll 14, and wound around the glass tube 12 in close contact with the outward peripheral surface of the glass tube due to guiding of the guide rollers 15 and 16. Thus, wound is a predetermined length as a unit length for measurement of the film-shaped solar battery 13. Subsequently, upon electrically connecting not-shown measuring electrodes to the film-shaped solar battery of the unit length for measurement, the solar battery is irradiated with the pseudo solar light from the xenon flash lamp 10 through the cooling tube with the optical property adjusting filter 11. Under this state, the I-V characteristics are measured by deriving an output from the film-shaped solar battery 13 through the measuring electrodes. Thereafter, upon detaching the measuring electrodes, only the prescribed unit length for measurement of film-shaped solar battery 13 is wound on the take-up roll 17, simultaneously the following unit length for measurement of film-shaped solar battery 13 is fed from the feed roll 14 and wound around the glass tube 12 in close contact with the outward peripheral surface thereof. Thereafter, the same processes are repeated until completing the I-V characteristics measurement for the entire length of the film-shaped solar battery 13.

As is described in detail above, the solar simulator of this embodiment is configured to irradiate the film-shaped solar battery 13 fed from the feed roll 14 and wound on the outward peripheral surface of the glass tube 12 with the pseudo solar light from the xenon flash lamp 10, so that even the long film-shaped solar battery can be continuously measured with regard to its output without being cut and a high-precision measurement can be performed over the entire area of the long film-shaped solar battery. Furthermore, as the light radially radiated from the xenon flash lamp 10 is applied to the solar battery, it is possible to lessen luminance unevenness and apply uniform collimated light. In addition, since the xenon flash lamp 10 is disposed at the same distance from any point of the film-shaped solar battery 13, it is possible to execute high-precision measurement over the entire area of the long film-shaped solar battery. Further, as the long film-shaped solar battery can be irradiated with the single xenon flash lamp 10, the entire size of the device can be reduced.

Figure 2:
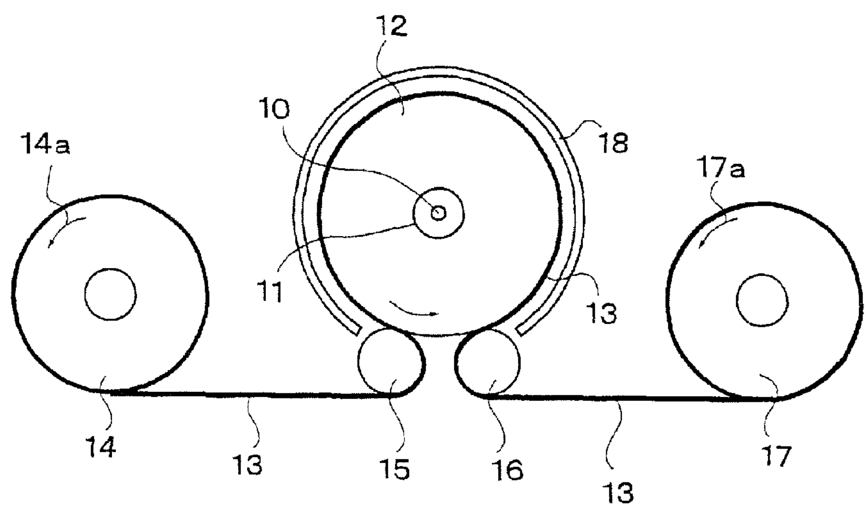
FIG. 2 is a side view schematically illustrating a partial configuration of a second embodiment of a solar simulator according to the present invention.

FIG. 2 schematically illustrates a configuration of a section irradiated with pseudo solar light in a second embodiment of the solar simulator according to the present invention. The solar simulator in this embodiment has substantially the same configuration as the solar simulator of the first embodiment illustrated in FIG. 1 except that a stray light shielding cover is used. Thus, in this embodiment, components similar to these in the first embodiment of FIG. 1 are denoted by the same numerical symbols.

In FIG. 2, reference numeral 18 denotes the stray light shielding cover having a low-reflectivity inward surface encircling the outward peripheral surface of the glass tube 12. The stray light shielding cover 18 is arranged coaxially with the xenon flash lamp 10, the cooling tube with the optical property adjusting filter 11, and the glass tube 12.

In the case where the film-shaped solar battery 13 is translucent, the additionally disposed stray light shielding cover 18 achieves effective absorption of the light passing through the film-shaped solar battery 13. As a result, it is possible to prevent occurrence of an errors in a measurement, caused by circumferential scattering of stray light.

Other configurations, operations, functions and advantages in this embodiment are the same as those in the first embodiment of FIG. 1.

Figure 3:
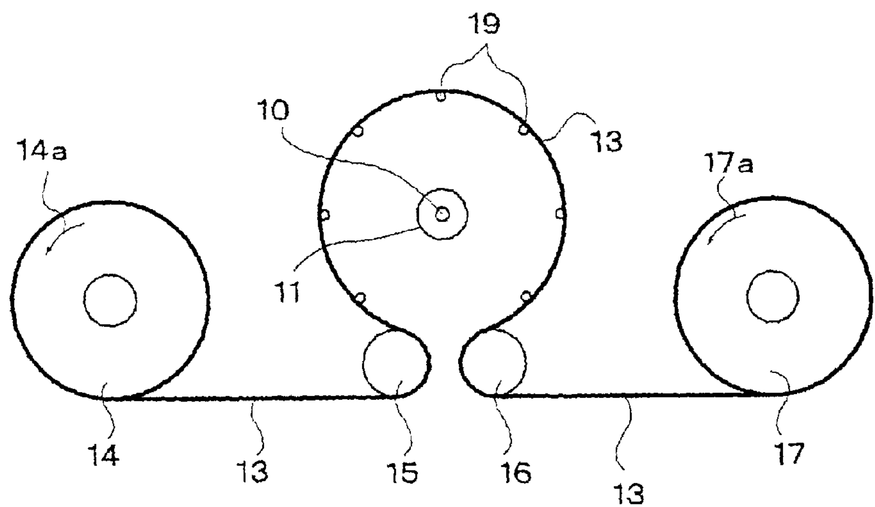
FIG. 3 is a side view schematically illustrating a partial configuration of a third embodiment of a solar simulator according to the present invention.

FIG. 3 schematically illustrates a configuration of a section irradiated with pseudo solar light in a third embodiment of the solar simulator according to the present invention. The solar simulator in this embodiment has substantially the same configuration as the solar simulator of the first embodiment illustrated in FIG. 1 except that a plurality of position regulating rollers are used in place of the glass tube. Thus, in this embodiment, components similar to these in the first embodiment of FIG. 1 are denoted by the same numerical symbols.

In FIG. 3, reference numeral 19 denotes the plurality (seven in the illustrated embodiment) of position regulating rollers arranged at positions, with the same distance from the optical axis, around the xenon flash lamp 10 and the cooling tube with the optical property adjusting filter 11.

The film-shaped solar battery 13 fed from the feed roll 14 is regulated in position by means of the outward surfaces of the position regulating rollers 19 under favor of guiding of the guide rollers 15 and 16 to surround the xenon flash lamp 10 in a cylinder shape so that a center of the regulated film-shaped solar battery is coaxial with the optical axis of the xenon flash lamp 10.

According to this embodiment, since no glass tube is necessary, although the cost of manufacturing can be reduced by just that much, unevenness of irradiation may possibly be caused because the light from the xenon flash lamp 10 is partly interrupted by the position regulating rollers 19. In this regard, however, such disadvantage is susceptible of improvement by making the diameter of the position regulating roller smaller or forming the position regulating roller of optically-transparent material. Incidentally, the number of the position regulating rollers 19 is optional. As the number of the position regulating rollers increases, the distance between the film-shaped solar battery 13 and the optical axis can be further equalized, but on the flipside of this, the light is blocked off by just that much to reduce the quantity of light.

Other configurations, operations, functions and advantages in this embodiment are the same as those in the first embodiment of FIG. 1.

Figure 4:
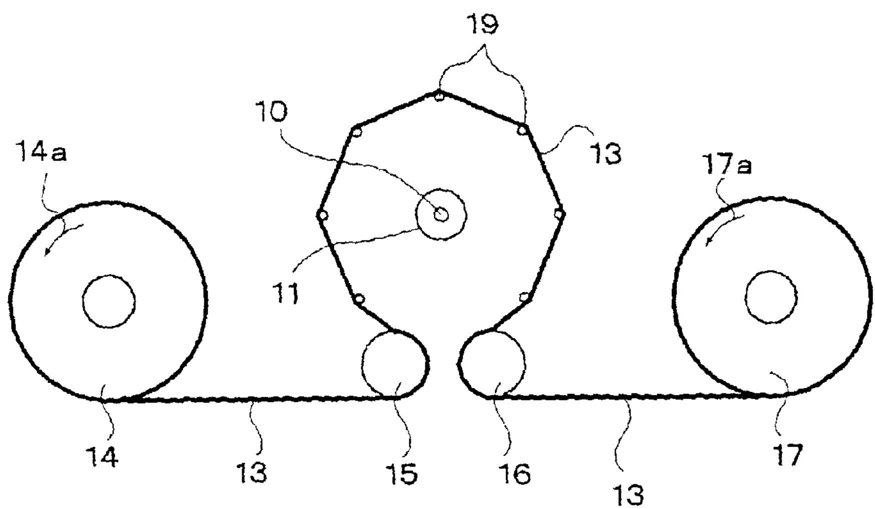
FIG. 4 is a side view schematically illustrating a partial configuration of a fourth embodiment of a solar simulator according to the present invention.

FIG. 4 schematically illustrates a configuration of a section irradiated with pseudo solar light in a fourth embodiment of the solar simulator according to the present invention. The solar simulator in this embodiment has substantially the same configuration as the solar simulator of the first embodiment illustrated in FIG. 1 except that a plurality of position regulating rollers are used in place of the glass tube. Thus, in this embodiment, components similar to these in the first embodiment of FIG. 1 are denoted by the same numerical symbols.

In FIG. 4, reference numeral 19 denotes the plurality (seven in the illustrated embodiment) of position regulating rollers arranged at positions, with the same distance from the optical axis, around the xenon flash lamp 10 and the cooling tube with the optical property adjusting filter 11.

In this embodiment, tensile force along the feeding direction relative to the film-shaped solar battery 13 is controlled to be increased by controlling the feed roll 14 and take-up roll 17 in rotation rate and rotary torque. Consequently, the film-shaped solar battery 13 fed from the feed roll 14 is regulated in position by means of the outward surfaces of the position regulating rollers 19 under favor of guiding of the guide rollers 15 and 16, but at that time, it is regulated in position to surround the xenon flash lamp 10 in a polygonal cylinder shape so that a center of the regulated film-shaped solar battery is coaxial with the optical axis of the xenon flash lamp 10.

According to this embodiment, since no glass tube is necessary in analogy with the third embodiment, although the cost of manufacturing can be reduced by just that much, unevenness of irradiation may possibly be caused because the light from the xenon flash lamp 10 is partly interrupted by the position regulating rollers 19. In this regard, however, such disadvantage is susceptible of improvement by making the diameter of the position regulating roller smaller or forming the position regulating roller of optically-transparent material. Incidentally, the number of the position regulating rollers 19 is optional. As the number of the position regulating rollers increases, the distance between the film-shaped solar battery 13 and the optical axis can be further equalized, but on the flipside of this, the light is blocked off by just that much to reduce the quantity of light.

Other configurations, operations, functions and advantages in this embodiment are the same as those in the first embodiment of FIG. 1.

Figure 5:
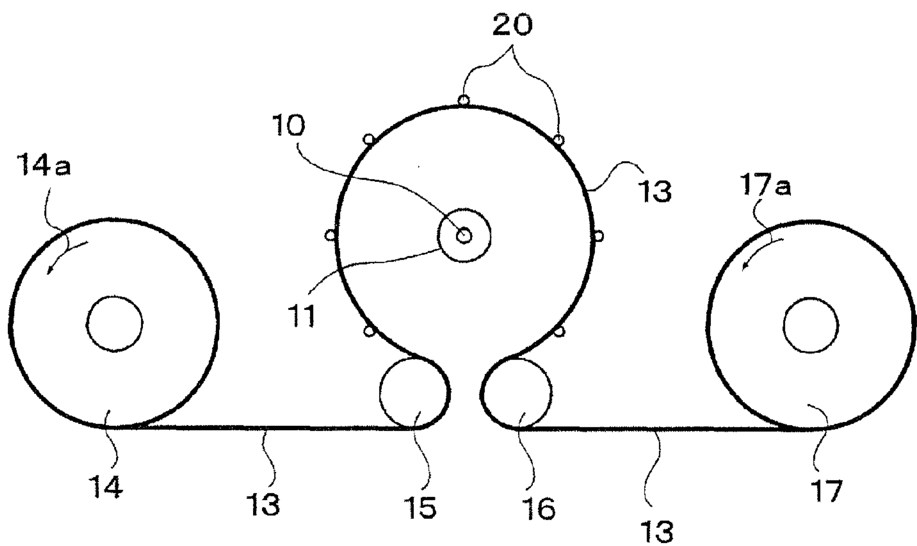
FIG. 5 is a side view schematically illustrating a partial configuration of a fifth embodiment of a solar simulator according to the present invention.

FIG. 5 schematically illustrates a configuration of a section irradiated with pseudo solar light in a fifth embodiment of the solar simulator according to the present invention. The solar simulator in this embodiment has substantially the same configuration as the solar simulator of the third embodiment illustrated in FIG. 3 except that the film-shaped solar battery is regulated in position by the inward surfaces of the position regulating rollers. Thus, in this embodiment, components similar to these in the first embodiment of FIG. 1 and the third embodiment of FIG. 3 are denoted by the same numerical symbols.

In FIG. 5, reference numeral 20 denotes the plurality (seven in the illustrated embodiment) of position regulating rollers arranged at positions, with the same distance from the optical axis, around the xenon flash lamp 10 and the cooling tube with the optical property adjusting filter 11.

The film-shaped solar battery 13 fed from the feed roll 14 is regulated in position by means of the inward surfaces of the position regulating rollers 20 under favor of guiding of the guide rollers 15 and 16 to surround the xenon flash lamp 10 in a cylinder shape so that a center of the regulated film-shaped solar battery is coaxial with the optical axis of the xenon flash lamp 10.

According to this embodiment, since no glass tube is necessary, the cost of manufacturing can be reduced by just that much. Also, the light from the xenon flash lamp 10 is not blocked by the position regulating rollers 19. Incidentally, the number of the position regulating rollers 19 is optional. As the number of the position regulating rollers increases, the distance between the film-shaped solar battery 13 and the optical axis can be further equalized.

Other configurations, operations, functions and advantages in this embodiment are the same as those in the first embodiment of FIG. 1 and the third embodiment of FIG. 3.

Figure 6:
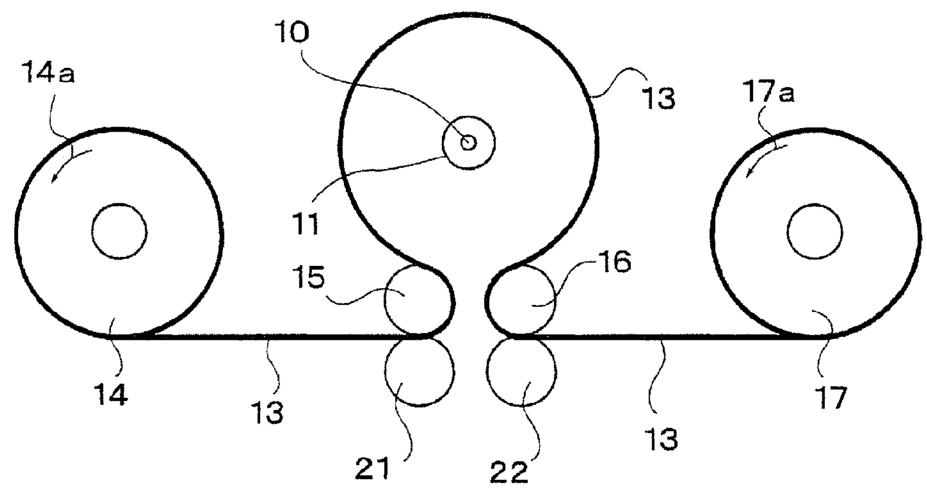
FIG. 6 is a side view schematically illustrating a partial configuration of a sixth embodiment of a solar simulator according to the present invention.

FIG. 6 schematically illustrates a configuration of a section irradiated with pseudo solar light in a sixth embodiment of the solar simulator according to the present invention. The solar simulator in this embodiment has the film-shaped solar battery self-standing by its own elasticity and regulated in position to surround the xenon flash lamp 10, but has no glass tube nor its alternative position regulating rollers. Other configurations of the solar simulator in this embodiment is substantially the same as that of the solar simulator of the first embodiment illustrated in FIG. 1. Thus, in this embodiment, components similar to these in the first embodiment of FIG. 1 are denoted by the same numerical symbols.

In FIG. 6, reference numerals 21 and 22 denote pinch rollers for providing accurately controlled driving power to the film-shaped solar battery 13. The pinch roller 21 presses the film-shaped solar battery 13 against the guide roller 15 and the pinch roller 22 presses the film-shaped solar battery 13 against the guide roller 16, thus to provide the accurate driving power to the film-shaped solar battery 13. Consequently, the film-shaped solar battery 13 can be regulated in position around the xenon flash lamp 10 in a self-standing state by its own elasticity without the glass tube and the position regulating rollers. That is, the film-shaped solar battery 13 fed from the feed roll 14 is regulated in position to surround the xenon flash lamp 10 in a cylinder shape so that a center of the regulated film-shaped solar battery is coaxial with the optical axis of the xenon flash lamp 10 under favor of guiding of the paired guide roller 10 and pinch roller 21 and the paired guide roller 16 and pinch roller 22.

According to this embodiment, since no position regulating roller is required, the cost of manufacturing can be reduced by just that much. Of course, a smaller number of position regulating rollers may be used in this embodiment.

Other configurations, operations, functions and advantages in this embodiment are the same as those in the first embodiment of FIG. 1.

Figure 7:
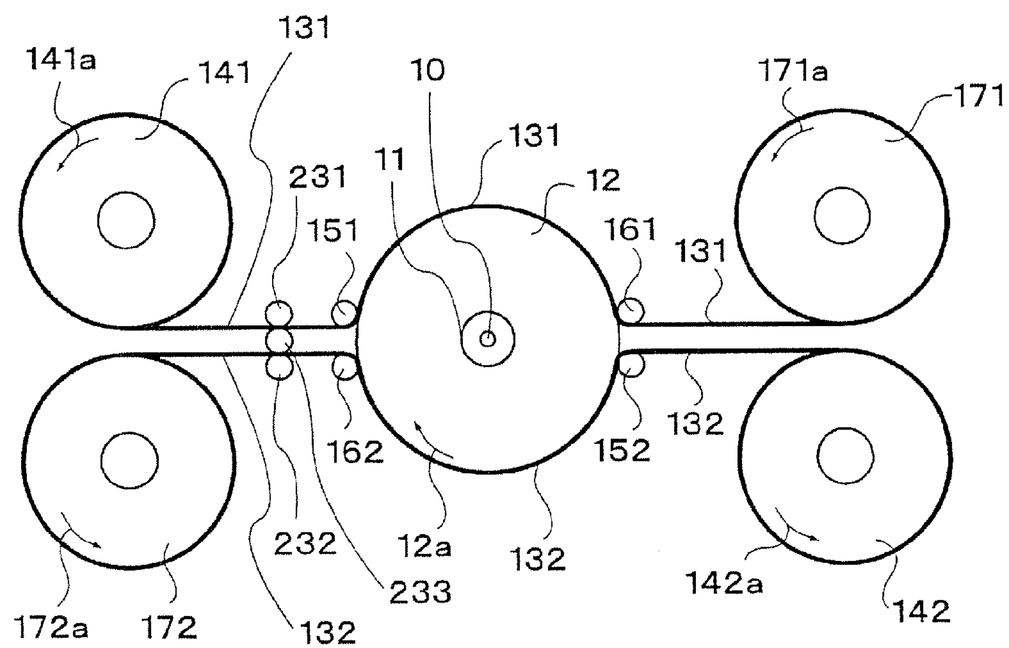
FIG. 7 is a side view schematically illustrating a partial configuration of a seventh embodiment of a solar simulator according to the present invention.

FIG. 7 schematically illustrates a configuration of a section irradiated with pseudo solar light in a seventh embodiment of the solar simulator according to the present invention. The solar simulator in this embodiment has substantially the same configuration as the solar simulator of the first embodiment illustrated in FIG. 1 except that two types of film-shaped solar batteries can be measured at one time. Thus, in this embodiment, components similar to these in the first embodiment of FIG. 1 are denoted by the same numerical symbols.

In FIG. 7, reference numeral 131 denotes a long continuous first film-shaped solar battery, 132 denotes a long continuous second film-shaped solar battery. The long continuous first film-shaped solar battery 131 and the long continuous second film-shaped solar battery 132 may have the same property or different properties, but should be measured simultaneously.

The first film-shaped solar battery 131 is for example an amorphous silicon solar cell formed on a long substrate of a continuous flexible plastic film. This first film-shaped solar battery 131 is fed from a first feed roll 141 (corresponding to a first feed means in the present invention), and rewound onto a first take-up roll 171 in a roll-to-roll manner. That is, the first film-shaped solar battery 131 is fed from the first feed roll 141 axially rotating in the direction shown by an arrow 141*a*, wound around the glass tube 12 in close contact with an upper part of the outward peripheral surface of the glass tube 12 under favor of guiding of guide rollers 151 and 161, and then, rewound on the take-up roll 171 axially rotating in the direction shown by an arrow 171*a* after completion of irradiation of the pseudo solar light and measurement.

The second film-shaped solar battery 132 is for example an amorphous silicon solar cell formed on a long substrate of a continuous flexible plastic film. This second film-shaped solar battery 132 is fed from a second feed roll 142 (corresponding to a second feed means in the present invention), and rewound onto a second take-up roll 172 in a roll-to-roll manner. That is, the second film-shaped solar battery 132 is fed from the second feed roll 142 axially rotating in the direction shown by an arrow 142*a*, wound around the glass tube 12 in close contact with a lower part of the outward peripheral surface of the glass tube 12 under favor of guiding of guide rollers 152 and 162, and then, rewound on the take-up roll 172 axially rotating in the direction shown by an arrow 172*a* after completion of irradiation of the pseudo solar light and measurement.

The glass tube 12 axially rotates in one direction shown by an arrow 12*a*. The first film-shaped solar battery 131 and the second film-shaped solar battery 141 move in the mutually opposite directions. In order to accurately control the feed rate of the film-shaped solar batteries, the first film-shaped solar battery 131 may preferably be fed by firmly holding it between rotating pinch roller 231 and common pinch roller 233, and the second film-shaped solar battery 132 may preferably be fed by firmly holding it between rotating pinch roller 232 and the common pinch roller 233.

Hereinafter, operations of the irradiation of the pseudo solar light and the measurement of the I-V characteristics in this embodiment will be described.

First, the first film-shaped solar battery 131 is fed from the first feed roll 141, and wound around the glass tube 12 in close contact with the upper part of the outward peripheral surface of the glass tube due to guiding of the guide rollers 151 and 161. Thus, wound is a predetermined length as a unit length for measurement of the first film-shaped solar battery 131. Also the second film-shaped solar battery 132 is fed from the second feed roll 142, and wound around the glass tube 12 in close contact with the lower part of the outward peripheral surface of the glass tube due to guiding of the guide rollers 152 and 162. Thus, wound is a predetermined length as a unit length for measurement of the second film-shaped solar battery 132. Subsequently, upon electrically connecting not-shown measuring electrodes to the first and second film-shaped solar batteries 131 and 132 of the unit length for measurement, the solar battery is irradiated with the pseudo solar light from the xenon flash lamp 10 through the cooling tube with the optical property adjusting filter 11. Under this state, the I-V characteristics are measured by deriving outputs from the first and second film-shaped solar batteries 131 and 132 through the measuring electrodes. Thereafter, upon detaching the measuring electrodes, only the prescribed unit lengths for measurement of the first and second film-shaped solar batteries 131 and 132 are wound on the first and second take-up rolls 171 and 172, respectively. Simultaneously the following unit lengths for measurement of the first and second film-shaped solar batteries 131 and 132 are fed from the first and second feed roll 14*a* and 142, and wound around the glass tube 12 in close contact with the upper part and the lower part of the outward peripheral surface thereof, respectively. Thereafter, the same processes are repeated until completing the I-V characteristics measurement for the entire lengths of the first and second film-shaped solar batteries 131 and 132.

As described in detail above, according to this embodiment, the I-V characteristics of the first and second film-shaped solar batteries 131 and 132 can be measured at one time by one system under the same measurement condition.

Other configurations, operations, functions and advantages in this embodiment are the same as those in the first embodiment of FIG. 1.

In the aforementioned embodiments, the position regulating rollers or guide rollers may be endowed with a vacuum sucking function. Consequently, the function of supporting the film-shaped solar battery, regulating the position of the solar battery and guiding the solar battery can be improved to enable measurement of higher precision.

Many widely different embodiments of the present invention may be constructed without departing from the spirit and scope of the present invention. It should be understood that the present invention is not limited to the specific embodiments described in the specification, except as defined in the appended claims.

INDUSTRIAL APPLICABILITY

The present invention provides outstanding applicability to measurement of photoelectric transfer characteristic of an irradiation object, especially a long continuous film-shaped irradiation object such as a long solar battery film, as a solar simulator for irradiating the irradiation object with pseudo solar light.

What is claimed is:

1. A solar simulator comprising:

a light source having an optical axis linearly elongated, said light source radially radiating light about the optical axis;

a feed means for feeding a long continuous film-shaped flexible solar battery; and a position regulating means for regulating said long continuous film shaped flexible solar battery in position to surround said light source so that a center of said long continuous film-shaped flexible solar battery is coaxial with said optical axis, said long continuous film-shaped flexible solar battery fed and regulated in position being irradiated with the light from said light source to measure I-V characteristics thereof.

2. The solar simulator as claimed in claim 1, wherein said position regulating means comprises a single cylinder arranged around said light source coaxially with said optical axis, wherein at least a surrounding wall of said single cylinder is formed of optically transparent material, and wherein said long continuous film-shaped flexible solar battery is wound around an outward peripheral surface of said single cylinder.

3. The solar simulator as claimed in claim 2, wherein said solar simulator further comprises a stray light shielding cover with an inward surface of low reflectivity arranged coaxially with said optical axis to surround the outward peripheral surface of said cylinder.

4. The solar simulator as claimed in claim 1, wherein said position regulating means comprises a plurality of position regulating rollers arranged at the same distance from said optical axis around said light source to regulate said long continuous film-shaped flexible solar battery in position on outward surfaces of said position regulating rollers.

5. The solar simulator as claimed in claim 1, wherein said solar simulator further comprises a tensioning means for imparting a tension force to said long continuous film-shaped flexible solar battery along a feeding direction of said long continuous film-shaped flexible solar battery.

6. The solar simulator as claimed in claim 1, wherein said position regulating means comprises a plurality of position regulating rollers arranged at the same distance from said optical axis around said light source to regulate said long continuous film-shaped flexible solar battery in position on inward surfaces of said position regulating rollers.

7. The solar simulator as claimed in claim 1, wherein said solar simulator further comprises a cylindrical characteristic-adjusting optical element arranged coaxially with said light source between said light source and said position regulating means to adjust spectral distribution characteristic.

8. The solar simulator as claimed in claim 1, wherein said light source comprises a straight xenon flash lamp.

9. A solar simulator comprising:

a light source having an optical axis linearly elongated;

a single cylinder arranged around said light source coaxially with said optical axis and having a surrounding wall formed of optically transparent material;

a first feed means for feeding a first long continuous film-shaped irradiation object;

a first position regulating means for regulating said first long continuous film-shaped irradiation object in position to wind said first long continuous film-shaped irradiation object around an upper part of an outward peripheral surface of said single cylinder;

a second feed means for feeding a second long continuous film-shaped irradiation object; and a second position regulating means for regulating said second long continuous film-shaped irradiation object in position to wind said second long continuous film-shaped irradiation object around a lower part of the outward peripheral surface of said single cylinder, said first and second long continuous film-shaped irradiation objects regulated in position being irradiated with the light from said light source.

10. The solar simulator as claimed in claim 9, wherein said solar simulator further comprises a tensioning means for imparting a tension force to said first and second long continuous film-shaped irradiation objects along feeding directions of said first and second long continuous film- shaped irradiation objects.

11. The solar simulator as claimed in claim 9, wherein said solar simulator further comprises a cylindrical characteristic-adjusting optical element arranged coaxially with said light source between said light source and said position regulating means to adjust spectral distribution characteristic.

12. The solar simulator as claimed in claim 9, wherein said light source comprises a straight xenon flash lamp.

13. A solar simulator comprising:

a light source having an optical axis linearly elongated, said light source radially radiating light about the optical axis;

a single cylinder arranged around said light source coaxially with said optical axis and having a surrounding wall formed of optically transparent material;

a first feed means for feeding a first long continuous film-shaped flexible solar battery;

a first position regulating means for regulating said first long continuous film-shaped flexible solar battery in position to wind said first long continuous film-shaped flexible solar battery around an upper part of an outward peripheral surface of said single cylinder;

a second feed means for feeding a second long continuous film-shaped flexible solar battery; and a second position regulating means for regulating said second long continuous film-shaped flexible solar battery in position to wind said second long continuous film-shaped flexible solar battery around a lower part of the outward peripheral surface of said single cylinder, said first and second long continuous film-shaped flexible solar batteries fed and regulated in position being irradiated with the light from said light source to measure I-V characteristics thereof.

14. The solar simulator as claimed in claim 13, wherein said solar simulator further comprises a tensioning means for imparting a tension force to said first and second long continuous film-shaped flexible solar batteries along feeding directions of said first and second long continuous film-shaped flexible solar batteries.

15. The solar simulator as claimed in claim 13, wherein said solar simulator further comprises a cylindrical characteristic-adjusting optical element arranged coaxially with said light source between said light source and said position regulating means to adjust spectral distribution characteristic.

16. The solar simulator as claimed in claim 13, wherein said light source comprises a straight xenon flash lamp.

* * * * *